United States Patent [19]

Pumo

[11] Patent Number: 4,621,202
[45] Date of Patent: Nov. 4, 1986

[54] BI-DIRECTIONAL BUS ISOLATION CIRCUIT

[75] Inventor: Joseph Pumo, Austin, Tex.

[73] Assignee: Motorola, Inc., Schaumburg, Ill.

[21] Appl. No.: 670,799

[22] Filed: Nov. 13, 1984

[51] Int. Cl.⁴ ................ H03K 19/096; H03K 17/693
[52] U.S. Cl. .................... 307/241; 307/242; 307/443; 307/453; 307/468; 307/572
[58] Field of Search ............ 307/200 A, 200 B, 443, 307/448, 453, 468, 481, 568, 241, 246, 572-573, 575, 577, 583, 270, 242-243; 340/825.87, 825.88, 825.91

[56] References Cited

U.S. PATENT DOCUMENTS

| | | | |
|---|---|---|---|
| 4,158,147 | 6/1979 | Edwards | 307/241 |
| 4,313,106 | 1/1982 | Hsu | 340/825.91 |
| 4,315,167 | 2/1982 | Pelc | 307/241 |
| 4,446,382 | 5/1984 | Moore et al. | 307/241 |
| 4,486,753 | 12/1984 | Saeki et al. | 340/825.91 |
| 4,488,066 | 12/1984 | Shoji | 307/443 X |
| 4,516,123 | 5/1985 | Shoji | 304/468 X |

*Primary Examiner*—Stanley D. Miller
*Assistant Examiner*—D. R. Hudspeth
*Attorney, Agent, or Firm*—Anthony J. Sarli, Jr.; Jeffrey Van Myers; James L. Clingan, Jr.

[57] ABSTRACT

A bi-directional bus isolation circuit couples the logic state present on a primary bus to a polysilicon secondary bus or the logic state present on the secondary bus to the primary bus in response to a select signal. A first NOR gate has one input coupled to the primary bus and a second input for receiving the select signal. A first output transistor couples the secondary bus to ground in response to the first NOR gate providing a logic high output. A second NOR gate has a first input coupled to the secondary bus, and a second input for receiving the select signal. A second output transistor couples the primary bus to ground in response to the second NOR gate providing a logic high output.

8 Claims, 1 Drawing Figure

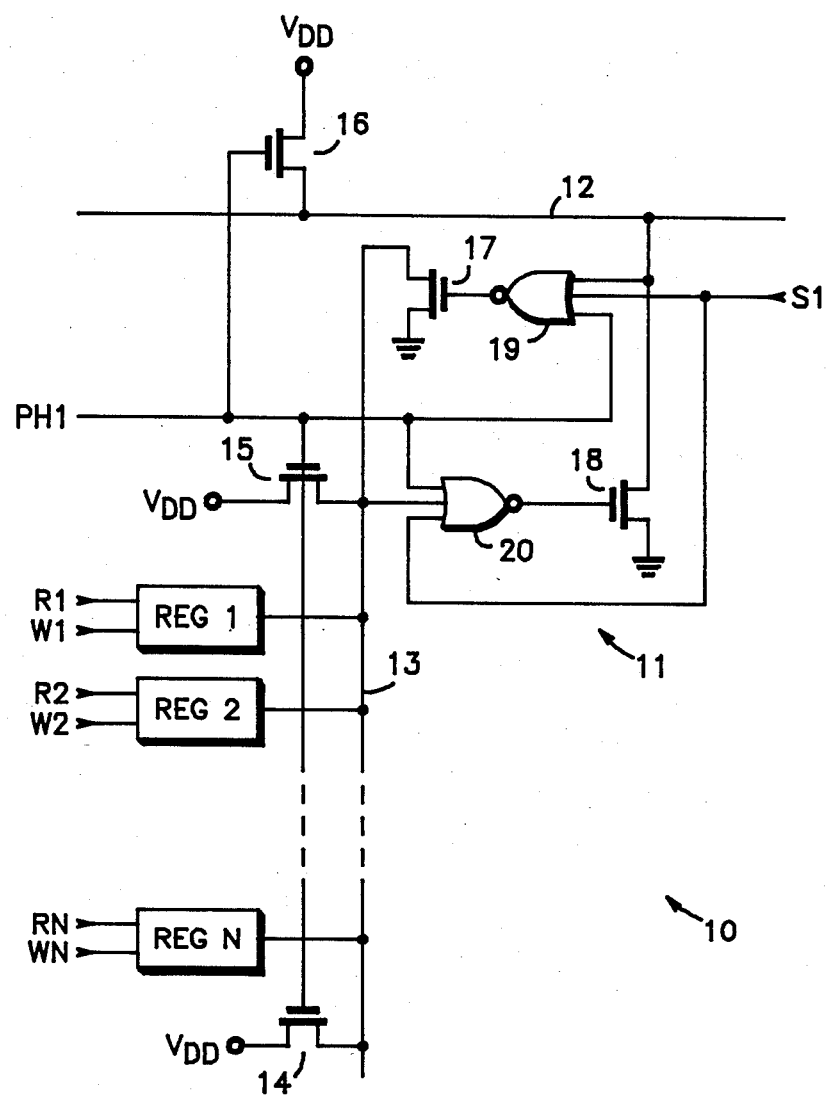

4,621,202

BI-DIRECTIONAL BUS ISOLATION CIRCUIT

FIELD OF THE INVENTION

The invention relates to isolation circuits, and more particularly, to bi-directional isolation circuits.

BACKGROUND OF THE INVENTION

In microcomputers and other microprocessor integrated circuits, multi-function registers are used for incrementing addresses, decrementing counts, storing control information, and storing status information as well as other functions. These registers are typically similar to static random access memories (SRAMs) in that each register stores one bit of information. The selection procedure is somewhat different than for SRAMs because the registers have predetermined functions and combinations of functions. Consequently the selecting (or decoding) can be more specific instead of supplying a general solution as provided by a standard SRAM. Additionally, the information is clocked from the registers in a predetermined fashion.

The lines which enable a register are called control lines. Each register receives and outputs data on a data line. Some registers are double-ended and some are single-ended. A double-ended register has a pair of input/output (I/O) terminals which are complementary. A single-ended register has a single I/O terminal. In a single-ended register system, precharging the I/O terminals increases speed. In a situation in which a large number of registers are to be coupled to the same primary bus or busses, the natural way of achieving this is by having all of these registers coupled to the same data line. This is fine if the data line is metal. Typically, however, there is only one metal layer. Consequently, only a limited number of lines can be in metal. It is thus desirable for the data line to be polysilicon. A long polysilicon line, however, has a slow response time and presents a significant load to a signal which drives such a line.

SUMMARY OF THE INVENTION

An object of the present invention is to provide an improved bi-directional bus isolation circuit.

Another object of the invention is to provide an improved technique for coupling register I/O terminals to a primary bus.

Yet another object of the invention is to provide an improved bus isolation circuit which reduces the loading effect of a register data line coupled to a primary bus.

These and other objects are achieved in a circuit having a primary bus, a secondary bus having a plurality of registers coupled thereto, a first logic gate, and a second logic gate. The first logic gate has a first input coupled to the primary bus, a second input for receiving a select signal, and an output coupled to the secondary bus. The second logic gate has a first input coupled to the secondary bus, a second input for receiving the select signal, and an output coupled to the primary bus.

BRIEF DESCRIPTION OF THE DRAWINGS

The FIGURE is a circuit diagram of a bus isolation circuit coupled between a primary bus and a secondary bus according to a preferred embodiment of the invention.

DESCRIPTION OF THE INVENTION

Shown in the sole FIGURE is a portion 10 of an integrated circuit comprising a bus isolation circuit 11, a primary bus 12, a secondary bus 13, a register REG 1, a register REG 2, a register REG N, a transistor 14, a transistor 15, and a transistor 16. Isolation circuit 11 comprises a transistor 17, a transistor 18, a NOR gate 19, and a NOR gate 20. Transistors 14–18 are N channel insulated gate field effect transistors having a threshold voltage of 0.6 to 0.8 volt.

Transistor 14 has a gate for receiving a signal PH1, a drain connected to a positive power supply terminal VDD for receiving, for example, 5 volts, and a source connected to secondary bus 13 near a bottom end of secondary bus 13. Transistor 15 has a gate for receiving signal PH1, a drain connected to VDD, and a source connected to secondary bus 13 near a top end of bus 13. Transistor 16 has a drain connected to VDD, a gate for receiving signal PH1, and a source connected to primary bus 12. Transistor 17 has a drain connected to secondary bus 13, a source connected to ground, and a gate. NOR gate 19 has a first input connected to primary bus 12, a second input for receiving a select signal S1, a third input for receiving signal PH1, and an output connected to the gate of transistor 17. Transistor 18 has a drain connected to primary bus 12, a source connected to ground, and a gate. NOR gate 20 has a first input for receiving signal PH1, a second input connected to secondary bus 13, a third input for receiving signal S1, and an output connected to the gate of transistor 18. REG 1 has a first input for receiving a read signal R1, a second input for receiving a write signal W1, and an I/O terminal connected to secondary bus 13. REG 2 has a first input for receiving a read signal R2, a second input for receiving a write signal W2, and an I/O terminal connected to secondary bus 13. REG N has a first input for receiving a read signal RN, a second input for receiving a write signal WN, and an I/O terminal connected to secondary bus 13.

Each register REG 1, REG 2, and REG N is a single-end register which provides an output on secondary bus 13 in response to read signal R1, R2 or RN, respectively, and which receives and stores the logic state present on secondary bus 13 in response to write signal W1, W2, or WN, respectively. Signal PH1 is one clock and a signal PH2 (not shown) is another which is complementary to signal PH1. A PH1 time is a time when signal PH1 is a logic high. A PH2 time is a time when signal PH2 is a logic high which is also when signal PH1 is a logic low. Each signal R1, R2, RN, W1, W2, and WN is clocked by signal PH2 so can be present only during a PH2 time.

Signal S1 determines when isolation circuit 11 couples primary bus 12 to secondary bus 13. When signal S1 is a logic low, they are coupled, and when signal S1 is a logic high they are decoupled. Additionally, they can be coupled only during a PH2 time. In the embodiment shown, primary bus 12 is metal and secondary bus 13 is polysilicon. Transistors 14 and 15 precharge secondary bus 13 to a logic high during PH1 time but are not conducting during PH2 time. A transistor at each end of secondary bus 13 is used to enhance precharging speed because the RC time delay of polysilicon tends to reduce speed. Transistor 16 precharges primary bus 12 to a logic high during PH1 time and is not conducting during PH2 time.

As an example, assume REG 1 is to be read and its contents provided to primary bus. During PH1 time primary bus 12 and secondary bus 13 are precharged to a logic high. During the next PH2 time, signal R1 occurs causing REG 1 to provide its contents to secondary bus 13, and signal S1 is a logic low. If REG 1 contains a logic low, then REG 1 will cause secondary bus 13 to switch to a logic low. With signal PH1, signal S1, and secondary bus 13 at a logic low, NOR gate 20 switches to a logic high which causes transistor 18 to pull primary bus 13 to a logic low. NOR gate 20 and transistor 18 operate together as an OR gate. Thus during PH2 time the logic low of REG 1 is thus provided to primary bus 12 via secondary bus 13 and isolation circuit 11. With primary bus 12 at a logic low NOR gate 19 provides a logic high to transistor 17 which reinforces the logic low on secondary bus 13. NOR gate 19 and transistor 17 operate together as an OR gate. When the next PH1 occurs, NOR gates 19 and 20 are both forced to provide logic low outputs. Transistors 17 and 18 thus become non-conducting as transistors 14-16 become conducting to provide the precharge function. If REG 1 contains a logic high instead of a logic low, REG 1 does not affect the logic high precharge on secondary bus 13. Even with signal PH1 and signal S1 being a logic low, NOR gate 20 provides a logic low output to transistor 18 during PH2 time. Consequently, transistor 18 is not conducting during PH2 time so that primary bus 12 remains a logic high. In such case then, the logic high of REG 1 is thus provided to primary bus 12.

Again using REG 1 for an example, a write function occurs when signal W1 occurs. During PH1 time, primary bus 12 and secondary bus 13 are precharged to a logic high. During the next PH2 time, signal W1 occurs, signal PH1 is a logic low, and signal S1 is a logic low. If a logic low is to be written into REG 1, primary bus 12 switches to a logic low. Because signal PH1 and signal S1 are a logic low, NOR gate 19 provides a logic high to transistor 17, causing transistor 17 to pull secondary bus 13 to a logic low. With signal W1 present and secondary bus 13 at a logic low, a logic low is written into REG 1. With secondary bus 13 at a logic low, NOR gate 20 provides a logic high to transistor 18, causing transistor 18 to reinforce the logic low on primary bus 12. Upon the termination of this PH2 time, signal PH1 switches to a logic high, and signal W1 switches to a logic low. As signal PH1 switches to a logic high, transistors 14 and 15 begin precharging secondary bus 13 to a logic high. It is important that REG 1 no longer be in a write mode as secondary bus 13 reaches a logic high otherwise a logic high will be written into REG 1. To avoid this, secondary bus 13 is polysilicon and conductors which carry control signals such as signals R1, W1, R2, W2, RN, and WN are metal. Consequently, removal of signal W1 occurs very quickly in response to the termination of PH2 time. With the very fast removal of signal W1, REG 1 is safely out of the write mode before secondary bus 13 is precharged to a logic high. Secondary busses such as secondary bus 13 being polysilicon allows for conductors carrying control signals such as signals R1, W1, R2, W2, RN, and WN to be metal.

For the case in which a logic high is to be written into REG 1, primary bus 12 remains at a logic high following the transition from PH1 time to PH2 time. Consequently, NOR gate 19 continues to provide a logic low output so that transistor 17 is not conducting. Secondary bus 13 remains at a logic high during PH2 time. With signal W1 present, REG 1 is in the write mode so that the logic state present on secondary bus 13 is written into REG 1. Because secondary bus 13 is at a logic high, a logic high is written into REG 1. With secondary bus 13 at a logic high, NOR gate 20 provides a logic low to transistor 18 so that transistor 18 remains non-conductive.

Bus isolation circuit 11 thus couples the logic state present on primary bus 12 to secondary bus 13 when select signal S1 is a logic low during a PH2 time. Such coupling by isolation circuit 11 does not have a loading effect on primary bus 12. Logic state coupling between primary bus 13 and secondary bus 12 could be achieved by a transmission gate, but with a consequent significant loading effect. Bus isolation circuit 11 is also effective for coupling the logic state of a register such as REG 1, REG 2, or REG N to primary bus 12 without being loaded down by primary bus 12. Bus isolation circuit 11 is thus efective for isolating the loading effects of primary bus 12 from secondary bus 13 but still effective for providing bi-directional logic state coupling therebetween. Additionally, bus isolation circuit 11 does not require a signal to indicate which direction the coupling is to occur. Bi-directional coupling is achieved by simply providing signal S1 at a logic low. NOR gates 19 and 20 could be just two input NOR gates and not use signal PH1 as an input. Signal PH1 is to ensure that bus isolation circuit 11 is not active during PH1 time which is when primary bus 12 and secondary bus 13 are precharged. This allows for signal S1 to be a logic low during PH1 time. Signal S1 can thus be independent of signal PH1.

Another bus isolation circuit such as bus isolation circuit 11 can be coupled to the bottom end of secondary bus 13 for coupling to another primary bus such as primary bus 12. Other secondary busses (not shown) are also coupled to primary bus 12 via other bus isolation circuits such as bus isolation circuit 11. Each of these other bus isolation circuits are selected by other select signals such as select signal S1 and are clocked by signal PH1. Using a bus isolation circuit such as bus isolation circuit 11, for each secondary bus coupled to primary bus 12 is useful for protecting primary bus 12 from the loading effect of the secondary busses coupled thereto.

I claim:

1. A circuit, comprising:
   a primary bus;
   a secondary bus;
   a plurality of registers each having an output coupled to the secondary bus;
   a first logic gate having a first input coupled to the primary bus, a second input for receiving a select signal, and an output coupled to the secondary bus;
   a second logic gate having a first input coupled to the secondary bus, a second input for receiving the select signal, and an output coupled to the primary bus; and
   a first precharge transistor having a control electrode for receiving a clock signal, a first current electrode coupled to a first power supply terminal, and a second current electrode coupled to the secondary bus.

2. The circuit of claim 1 wherein the first logic gate comprises:
   a first NOR gate having a first input coupled to the primary bus, a second input for receiving the select signal, and an output; and a first output transistor having a control electrode coupled to the output of the first NOR gate, a first current electrode coupled to the secondary bus, and a second current electrode coupled to a second power supply terminal.

3. The circuit of claim 3 wherein the first NOR gate has a third input for receiving the clock signal.

4. The circuit of claim 3 further comprising a second precharge transistor having a control electrode for receiving the clock signal, a first current electrode coupled to the first power supply terminal, and a second current electrode coupled to the primary bus.

5. The circuit of claim 4 wherein the second logic gate comprises:
   a second NOR gate having a first input coupled to the secondary bus, a second input for receiving the select signal, and an output; and
   a second output transistor having a control electrode coupled to the output of the second NOR gate, a first current electrode coupled to the primary bus, and a second current electrode coupled to the second power supply terminal.

6. The circuit of claim 5 wherein the second NOR gate has a third input for receiving the clock signal.

7. The circuit of claim 6 wherein the primary bus is metal and the secondary bus is polysilicon.

8. A bus isolation circuit coupled between a polysilicon secondary bus having a plurality of registers coupled thereto and a primary bus, comprising:
   a first NOR gate having a first input for receiving a select signal, a second input coupled to the primary bus, and an output;
   a first output transistor having a control electrode coupled to the output of the first NOR gate, a first current electrode coupled to the secondary bus, and a second current electrode coupled to a first power supply terminal;
   a second NOR gate having a first input for receiving the select signal, a second input coupled to the secondary bus, and an output; and
   a second output transistor having a control electrode coupled to the output of the second NOR gate, a first current electrode coupled to the primary bus, and a second current electrode coupled to the first power supply terminal.

* * * * *

UNITED STATES PATENT AND TRADEMARK OFFICE
CERTIFICATE OF CORRECTION

PATENT NO. : 4,621,202
DATED : November 4, 1986
INVENTOR(S) : Joseph Pumo

It is certified that error appears in the above-identified patent and that said Letters Patent is hereby corrected as shown below:

Claim 3, line 1, change "3" to --2--.

Signed and Sealed this

Twenty-seventh Day of January, 1987

Attest:

DONALD J. QUIGG

Attesting Officer    Commissioner of Patents and Trademarks